US006497806B1

(12) United States Patent
Endo

(10) Patent No.: US 6,497,806 B1
(45) Date of Patent: Dec. 24, 2002

(54) METHOD OF PRODUCING A ROUGHENING-TREATED COPPER FOIL

(75) Inventor: Yasuhiro Endo, Shimodate (JP)

(73) Assignee: Nippon Denkai, Ltd., Tokyo (JP)

( * ) Notice: Subject to any disclaimer, the term of this patent is extended or adjusted under 35 U.S.C. 154(b) by 1 day.

(21) Appl. No.: 09/838,228

(22) Filed: Apr. 20, 2001

(51) Int. Cl.$^7$ ................................................ C25D 5/00
(52) U.S. Cl. ..................... 205/111; 205/170; 205/176; 205/182; 205/238; 205/239; 205/240
(58) Field of Search ................................ 205/111, 170, 205/176, 181, 182, 238, 239, 240, 244, 245

(56) References Cited

U.S. PATENT DOCUMENTS

| | | | | |
|---|---|---|---|---|
| 4,551,210 A | * | 11/1985 | Parthasarathi | 204/207 |
| 4,961,828 A | * | 10/1990 | Lin et al. | 205/109 |
| 5,019,222 A | * | 5/1991 | Hino et al. | 205/152 |
| 5,366,814 A | * | 11/1994 | Yamanishi et al. | 205/111 |
| 5,385,660 A | * | 1/1995 | Herbert et al. | 205/111 |

FOREIGN PATENT DOCUMENTS

| | | | |
|---|---|---|---|
| JP | 08236930 A | * | 9/1996 |
| JP | 11256389 A | * | 9/1999 |

OTHER PUBLICATIONS

English Abstract for JP 08236930 A, Sep. 13, 1996.*
English Abstract for JP 11256389 A, Sep. 21, 1999.*

* cited by examiner

Primary Examiner—Nam Nguyen
Assistant Examiner—Wesley A. Nicolas
(74) Attorney, Agent, or Firm—Antonelli, Terry, Stout, & Kraus, LLP

(57) ABSTRACT

A method of producing a roughening-treated copper foil, comprising (A) a copper foil, (B) a composite metal layer, which is formed on a bonding surface of the copper foil and comprises (I) copper, (II) at least one metal selected from the group consisting of tungsten and molybdenum and (III) at least one metal selected from the group consisting of nickel, cobalt, iron and zinc, and (C) a roughened layer comprising copper, which is formed on the composite metal layer.

2 Claims, 1 Drawing Sheet

METHOD OF PRODUCING A ROUGHENING-TREATED COPPER FOIL

BACKGROUND OF THE INVENTION (a) Field of the Invention

The present invention relates to a roughening-treated copper foil useful for printed wiring boards or the like and to the production thereof, particularly, to a roughening-treated copper foil, which is useful for printed wiring boards due to its excellent adhesive strength to resin base materials of high Tg's (glass transition temperature), such as FR-5, and to a method suitable for the production thereof.

(b) Description of the Related Art

Copper foil for printed wiring boards generally has a bonding surface, which is previously roughened by some means to give higher adhesive strength on lamination onto resin base materials. For electrolytic copper foil, plating methods are mainly used as the roughening treatment. Japanese Patent Application Examined Publication No. 53-39376 (1978) discloses an example of the plating methods. According to the method, first a dendritic copper electrodeposition layer is formed on at least one bonding surface of a copper foil as a cathode by the so-called burning plating in an acidic copper plating bath at a current of the limiting current density or higher, then a smooth copper electrodeposition layer is formed on the dendritic copper electrodeposition layer at a current of a current density lower than the limiting current density (covering plating) to change the dendritic copper into nodular copper and to increase the adhesive strength by the nodular copper. After the formation of the nodular copper by the electrolysis treatment, the surface of the copper foil has a larger specific surface than before the electrolysis treatment, and the nodular copper works as an anchor, improving the adhesive strength between resin base materials and the copper foil. When nodular copper is formed on electrolytic copper foil, which generally has a surface (mat surface) rougher than the other surface (shiny surface), current is mainly centered to convexes, and the formation of the nodular copper is centered on the extreme ends of the convexes.

The recent spread of note type personal computers and pocket telephones has increased the use of glass-epoxy printed wiring boards produced by using as resin base materials FR-5 materials having high Tg's. As compared with conventional FR-4 materials, epoxy resins having high Tg's are more resistive to heat but have lower adhesive strength to copper foil. A means of enhancing the adhesive strength of copper foil to resin base materials is to increase the roughness of the bonding surface of copper foil. However, increasing the surface roughness tends to cause the so-called copper powder-falling off that is the falling of nodular copper even with small abrasion force and the so-called residual copper that is nodular copper left in resin base materials after the etching step in the production of printed circuits.

Japanese Patent Application Examined Publication No. 54-38053 (1979) discloses an improved method of forming a roughened surface by carrying out electrolysis treatment at an approximate limiting current density in an acidic copper plating bath to which a specific amount of at least one metal selected from arsenic, antimony, bismuth, selenium and tellurium is added. The addition of a very small amount of arsenic, antimony, bismuth, selenium or tellurium permits the formation of minute projections, but cannot solve the problem centering to the convexes on the copper foil. Further, using copper foil containing arsenic, antimony, bismuth, selenium or tellurium, which are poisons or deadly poisons, in printed wiring boards causes the problem of environmental pollution on discarding etching waste liquors or the printed wiring boards.

Addition of benzoquinoline to an acidic copper plating bath (Japanese Patent Application Examined Publication No. 56-41196 (1981)) or addition of molybdenum (Japanese Patent Application Examined Publication No. 62-56677 (1987)) are also proposed, but cannot improve adhesive strength sufficiently.

Japanese patent Application Unexamined Publication No. 8-236930 (1996) discloses a method for solving the problem, wherein electrolysis is carried out at approximate limiting current density in an acidic copper plating bath containing metal ions of at least one metal selected from chromium and tungsten and metal ions of at least one metal selected from vanadium, nickel, iron, cobalt, zinc, germanium and molybdenum, to form a roughening-treated layer containing the metals added. Japanese Patent Application Unexamined Publication No. 11-256389 (1999) discloses a method of carrying out electrolysis at approximate limiting current density in an acidic copper plating bath containing molybdenum ions and metal ions of at least one metal selected from iron, cobalt, nickel and tungsten, to form a layer of burnt deposits (a layer formed by burning plating) containing the metals added.

These methods, however, also cause the phenomena of copper powder-falling off and residual copper because nodular copper is formed exclusively on the extreme ends of the convexes on copper foil.

SUMMARY OF THE INVENTION

An object of the present invention is to solve the problems in the prior arts. That is, an object of the present invention is to provide a roughening-treated copper foil, which is suitable for printed wiring boards due to its high adhesive strength to resin base materials, by treating the bonding surface of copper foil by electrolysis so as to form nodular copper not only on the convexes on the bonding surface but also on the concaves thereon without increasing the surface roughness.

Another object of the present invention is to provide a method suitable for producing the roughening-treated copper foil.

Accordingly, the present invention provides a roughening-treated copper foil, comprising
(A) a copper foil,
(B) a composite metal layer, which is formed on a bonding surface of the copper foil and comprises (I) copper, (II) at least one metal selected from the group consisting of tungsten and molybdenum and (III) at least one metal selected from the group consisting of nickel, cobalt, iron and zinc, and
(C) a roughened layer comprising copper, which is formed on the composite metal layer.

Herein, the terms "the bonding surface of a copper foil" mean a surface of a copper foil, which faces an adherent when the copper foil is bonded to the adherent.

The present invention further provides a method of producing a roughening-treated copper foil, comprising
treating a copper foil as a cathode by electrolysis in a plating bath containing (i) copper ions, (ii) metal ions of at least one metal selected from the group consisting of tungsten and molybdenum and (iii) metal ions of at least one metal selected from the group consisting of nickel, cobalt, iron and zinc, at a current density lower than a limiting current density of the plating bath, to form on the copper foil a composite metal layer comprising (I) copper, (II) at least one metal selected from the group consisting of tungsten and molybdenum and (III) at least one metal selected from the group consisting of nickel, cobalt, iron and zinc; and forming a roughened layer comprising copper on the composite metal layer by carrying out electrolysis in a plating bath containing copper ions at a current density not lower than a limiting current density of the plating bath to form a dendritic copper electrodeposition layer, and then carrying out subsequent electrolysis at a current density lower than the limiting current density of the plating bath to form nodular copper. Herein, the terms "the limiting current density of the plating bath" mean a current density at which generation of hydrogen accompanies the cathode reaction for the deposition of the metals or metal compounds.

DESCRIPTION OF THE PREFERRED EMBODIMENTS

Figure 1:
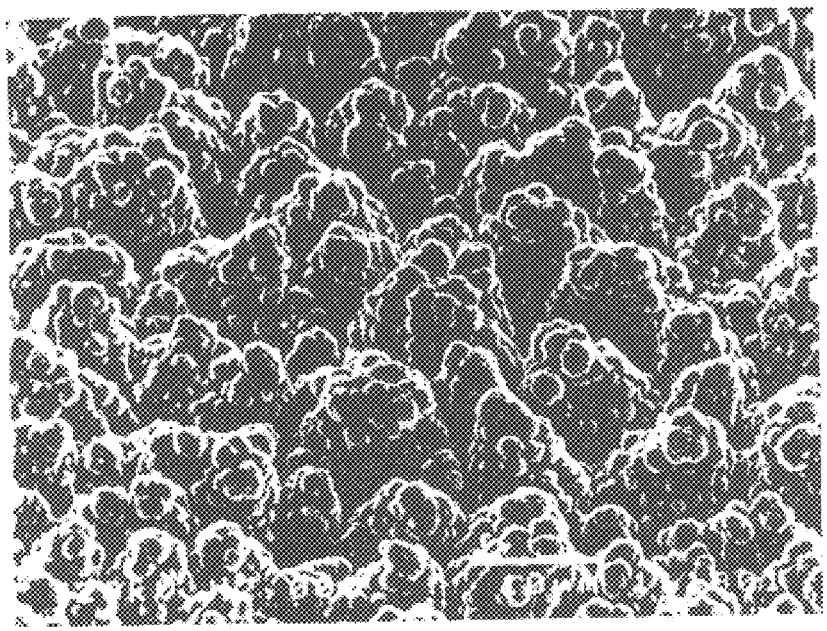
FIG. 1 is a scanning electron microscope photograph showing the roughened surface of the roughening-treated copper foil obtained in Example 1.

A preferred example of the copper foil (raw copper foil) to be used in the present invention is electrolytic copper foil. It is also possible to use other ones, such as rolled copper foil or plastic film coated with copper film by, for example, vacuum plating. There is no particular limitation in the thickness of the copper foil and the roughness and form of the surfaces of the copper foil. The copper foil may have one or two bonding surfaces.

The bonding surface of the copper foil is coated with a composite metal layer, which comprises (I) preferably 5,000 to 10,000 $\mu g/dm^2$ of copper, (II) preferably 10 to 1,000 $\mu g/dm^2$, more preferably 100 to 1,000 $\mu g/dm^2$ of at least one metal selected from the group consisting of tungsten and molybdenum and (III) preferably 10 to 1,000 $\mu g/dm^2$, more preferably 10 to 300 $\mu g/dm^2$ of at least one metal selected from the group consisting of nickel, cobalt, iron and zinc, all in coating amount.

If the coating amount of the at least one metal selected from the group consisting of nickel, cobalt, iron and zinc is less than 10 $\mu g/dm^2$, the formation of the nodular copper by the plating may not extend to the concaves on the copper foil, but be centered to the convexes, and if more than 1,000 $\mu g/dm^2$, etching the plated layer may require very long time to remove unnecessary copper to form copper circuits. The coating amount of the at least one metal selected from the group consisting of nickel, cobalt, iron and zinc depends on the composition of the plating bath and the treating conditions, which may be selected from those described later.

If the coating amount of copper in the composite metal layer is less than 5,000 $\mu g/dm^2$, the nodular copper may not be formed on the entire concaves, and if more than 10,000 $\mu g/dm^2$, the formation of the nodular copper on the entire concaves may be less effective and the production cost may increase. If the coating amount of the at least one metal selected from the group consisting of tungsten and molybdenum in the composite metal layer is less than 10 $\mu g/dm^2$, nodular copper may not be formed on the entire concaves, and if more than 1,000 $\mu g/dm^2$, the nodular copper may not grow large. The composite metal layer is preferably 0.05 to 0.15 $\mu m$ thick, more preferably 0.07 to 0.12 $\mu m$ thick.

According to the present invention, the composite metal layer is formed by treating the bonding surface of a copper foil as a cathode by electrolysis in a plating bath containing (i) copper ions, (ii) metal ions of at least one metal selected from the group consisting of tungsten and molybdenum and (iii) metal ions of at least one metal selected from the group consisting of nickel, cobalt, iron and zinc, at a current density lower than the limiting current density of the plating bath. The bonding surface of the copper foil is preferably subjected to pickling and degreasing prior to the electrolysis.

The sources of the metal ions in the plating bath are water-soluble metal salts. The following is a non-limitative but preferred range of the composition of the bath.

copper ion source—copper sulfate pentahydrate: 10–100 g/l
tungsten ion source—sodium tungstate dehydrate: 0.01–20 g/l
molybdenum ion source—sodium molybdate dehydrate: 0.5–20 g/l
nickel ion source—nickel sulfate hexahydrate
cobalt ion source—cobalt sulfate heptahydrate
iron ion source—ferrous sulfate heptahydrate
zinc ion source—zinc sulfate heptahydrate
the total of nickel sulfate hexahydrate, cobalt sulfate heptahydrate, ferrous sulfate heptahydrate and zinc sulfate heptahydrate: 10–100 g/l So far as the current density is lower than the limiting current density of the plating bath, the electrolysis conditions are not limited, and are generally selected from the following ranges.

current density: 1–10 $A/dm^2$
electrolysis treatment period: 1–30 sec.
bath temperature: 10–60° C.

The preferred pH of the plating bath ranges from 1.5 to 5.0. If the pH is lower than 1.5, the preferred ranges of the coating amounts of the at least one metal selected from the group consisting of tungsten and molybdenum and the at least one metal selected from the group consisting of nickel, cobalt, iron and zinc in the composite layer may be narrowed, so that the formation of nodular copper by the plating does not extend to the concaves on the copper foil but be centered on the convexes. If the pH is higher than 5.0, it may take a very long time to dissolve the metal ions of at least one metal selected from tungsten and molybdenum, lowering the productivity. The pH more preferably ranges from 2.0 to 4.0.

By forming the composite metal layer, fine particles are formed on the convexes on the copper foil, but cannot give sufficient adhesive strength as they are or even after coated with copper by burning plating or covering plating. To improve adhesive strength, a roughened layer comprising copper is formed on the composite metal layer by using both burning plating and covering plating to deposit nodular copper further on the concaves on the copper foil.

That is, the copper foil treated under the above-described conditions is washed with water, and then a roughened layer comprising copper is formed on the composite metal layer by carrying out burning plating whereby a dendritic copper electrodeposition layer is formed by electrolysis in a plating bath containing copper ions at a current density not lower than the limiting current density of the plating bath, followed by covering plating whereby nodular copper is formed by electrolysis at a current density lower than the limiting current density of the plating bath.

The coating amount of copper in the roughened layer comprising copper is preferably 30,000 to 300,000 $\mu g/dm^2$. If it is less than 30,000 $\mu g/dm^2$, copper nodules may be too small to give sufficient adhesive strength, and if more than 300,000 $\mu g/dm^2$, adhesive strength may be sufficient, but the production cost will be problematically high. More preferred coating amount is 100,000 to 200,000 $\mu g/dm^2$. The combined step of burning plating/covering plating may be repeated to form the roughened layer comprising copper.

In cases where the roughened layer comprising copper is formed by using a common sulfuric acid-acidic copper sulfate bath, preferred but non-limitative examples of the composition of the bath and electrolysis conditions are as follows.

copper ion source—copper sulfate pentahydrate: 20–300 g/l
sulfuric acid: 10–200 g/l
current density: burning plating (not lower than limiting current density of the plating bath)—10–200 A/dm$^2$; covering plating (lower than limiting current density or the plating bath)—1–20 A/dm$^2$
electrolysis treatment period: burning plating—1–10 seconds; covering plating—40–100 seconds
bath temperature: 20–60° C.

On the copper foil coated with the roughened layer comprising copper, it is preferable to form other layers commonly formed on copper foil, for example, a rust preventing layer, such as a chromate layer, a zinc layer, a copper-zinc alloy layer, a zinc alloy layer, a nickel-molybdenum-cobalt layer or an indium-zinc layer, a coupling agent treatment layer, or an adhesive resin layer, such as a phenolic resin, epoxy resin or polyimide resin layer, according to demands. The roughening-treated copper foil coated with the above-described layers is laminated onto a resin base material with heat and pressure, to form a copper-clad laminate for printed wiring boards.

Hereinafter the present invention will be described in more detail referring to Examples and Comparative Examples, which, however, do not limit the scope of the present invention.

EXAMPLES 1 TO 8 AND COMPARATIVE EXAMPLES 1 TO 8

Example 1

(1) A 35 $\mu$m thick electrolytic copper foil (surface roughness Ra of mat surface: 0.9 $\mu$m as measured according to JIS B 0601) was subjected to pickling for 20 seconds by using a 10% sulfuric acid solution.

(2) The copper foil was then washed with water, and the mat surface (bonding surface) of the copper foil was treated by electrolysis at a current density of 6 A/dm$^2$ for 4 seconds in a plating bath, which contained 50 g/l of copper sulfate pentahydrate, 2 g/l of sodium molybdate dehydrate and 50 g/l of nickel sulfate hexahydrate and was adjusted to pH 3.0 and to a bath temperature of 30° C., to form on the bonding surface of the copper foil a composite metal layer containing copper molybdenum and nickel. The coating amounts of the metals in the composite metal layer were measured by an ICP (inductively coupled plasma luminescent) analyzer to be 7,900 $\mu g/dm^2$ of copper, 178 $\mu g/dm^2$ of molybdenum and 145 $\mu g/dm^2$ of nickel. After the treatment, the treated surface had a surface roughness Ra of 0.9 $\mu$m.

(3) The copper foil was then washed with water, and the surface of the composite metal layer was treated by ① electrolysis at a current density of 30 A/dm$^2$ (not lower than the limiting current density) for 3 seconds followed by ② electrolysis at 5 A/dm$^2$ (lower than the limiting current density) for 80 seconds both in a plating bath containing 130 g/l of copper sulfate pentahydrate and 100 g/l of sulfuric acid and adjusted to a bath temperature of 30° C., to form a roughened layer comprising copper. The roughened layer comprising copper had a coating amount of copper of 150,000 $\mu g/dm^2$ and a surface roughness Ra of 1.4 $\mu$m. On the roughening-treated electrolytic copper foil was observed nodular copper formed all over the irregularities on the copper foil. FIG. 1 shows a scanning electron microscope photograph (magnification: 2000, object angle: 45°) of the roughened surface.

(4) The copper foil was then washed with water, and dipped for 10 seconds in an aqueous solution of 3.5 g/l of sodium bichromate dehydrate adjusted to pH 4.2 and a bath temperature of 28° C., to form a rust preventing layer.

(5) The copper foil was then washed with water, dipped for 10 seconds in an aqueous solution of 0.1 wt % 3-glycidoxypropyltrimethoxysilane, and then immediately dried at 80° C., to form a silane coupling agent treatment layer.

(6) To measure adhesive strength, a copper-clad laminate was produced by laminating the copper foil onto a glass-epoxy resin impregnation base material corresponding to FR-5 with the bonding surface of the copper foil facing the base material, and a test piece was cut out therefrom. The adhesive strength between the copper foil and the resin base material of the test piece was measured at room temperature according to JIS C 6481 (copper foil width: 1 mm). The copper foil of the copper-clad laminate was etched away with an aqueous cupric chloride solution, and the surface of the base material was then observed at arbitrary 10 points with a scale magnifying lens (magnification: 60, the range of vision: 2 mm$\phi$) for the existence of residual nodular copper in the resin base material. A commercial pressure sensitive adhesive tape roll (CR ROLLER produced by Rintekku Kabushiki Kaisha) was rolled over the roughened surface of the copper foil. The pressure sensitive adhesive tape (80 mm wide×200 mm long) on the surface of the roll was then unrolled with the adhesive side looking downward, applied onto a white paper and observed at arbitrary 10 points on the surface of the tape with a scale magnifying lens (magnification: 60, the range of vision: 2 mm$\phi$) for the falling of nodular copper (powder falling). The results of the measurements and observation are listed in Table 1.

Example 2

After the same electrolytic copper foil as that used in Example 1 was pickled and washed with water in the same manner as in Example 1, the mat surface (bonding surface) of the copper foil was treated by electrolysis at a current density of 6 A/dm$^2$ for 4 seconds in a plating bath, which contained 50 g/l of copper sulfate pentahydrate, 2 g/l of sodium molybdate dehydrate, 30 g/l of cobalt sulfate heptahydrate and 30 g/l of ferrous sulfate heptahydrate and was adjusted to pH 2.0 and to a bath temperature of 30° C., to form on the bonding surface of the copper foil a composite metal layer containing copper, molybdenum, cobalt and iron. The coating amounts of the metals in the composite metal layer were measured by an ICP (inductively coupled plasma luminescent) analyzer to be 7,900 $\mu g/dm^2$ of copper, 180 $\mu g/dm^2$ of molybdenum, 12 $\mu g/dm^2$ of cobalt and 50 $\mu g/dm^2$ of iron. After the treatment, the treated surface had a surface roughness Ra of 0.9 $\mu$m. Subsequently, a roughened layer comprising copper was formed in the same manner as in Example 1. The roughened layer comprising copper had a coating amount of copper of 150,000 μg/dm² and a surface roughness Ra of 1.5 μm. On the roughening-treated electrolytic copper foil was observed nodular copper formed all over the irregularities on the copper foil.

After the treatments (4) and (5) of Example 1 were carried out, the measurement of adhesive strength and tests for residual copper and powder falling were carried out in the same manner as in Example 1 (6), and the results are listed in Table 1.

Example 3

After the same electrolytic copper foil as that used in Example 1 was pickled and washed with water in the same manner as in Example 1, the mat surface (bonding surface) of the copper foil was treated by electrolysis at a current density of 7 A/dm² for 4 seconds in a plating bath, which contained 50 g/l of copper sulfate pentahydrate, 2 g/l of sodium molybdate dihydrate and 50 g/l of zinc sulfate heptahydrate and was adjusted to pH 2.5 and to a bath temperature of 30° C., to form on the bonding surface of the copper foil a composite metal layer containing copper, molybdenum and zinc. The coating amounts of the metals in the composite metal layer were measured by an ICP (inductively coupled plasma luminescent) analyzer to be 9,200 μg/dm² of copper, 230 μg/dm² of molybdenum and 159 μg/dm² of zinc. After the treatment, the treated surface had a surface roughness Ra of 0.9 μm. Subsequently, a roughened layer comprising copper was formed in the same manner as in Example 1. The roughened layer comprising copper had a coating amount of copper of 150,000 μg/dm² and a surface roughness Ra of 1.4 μm. On the roughening-treated electrolytic copper foil was observed nodular copper formed all over the irregularities on the copper foil.

After the treatments (4) and (5) of Example 1 were carried out, the measurement of adhesive strength and tests for residual copper and powder falling were carried out in the same manner as in Example 1 (6), and the results are listed in Table 1.

Example 4

After the same electrolytic copper foil as that used in Example 1 was (1) pickled in the same manner as in Example 1, (2) the copper foil was washed with water in the same manner as in Example 1, and the mat surface (bonding surface) of the copper foil was treated by electrolysis at a current density of 6 A/dm² for 4 seconds in a plating bath, which contained 50 g/l of copper sulfate pentahydrate, 2 g/l of sodium tungstate dihydrate and 50 g/l of nickel sulfate hexahydrate and was adjusted to pH 3.0 and to a bath temperature of 30° C., to form on the bonding surface of the copper foil a composite metal layer containing copper, tungsten and nickel. The coating amounts of the metals in the composite metal layer were measured by an ICP (inductively coupled plasma luminescent) analyzer to be 7,900 μg/dm² of copper, 158 μg/dm² of tungsten and 145 μg/dm² of nickel. After the treatment, the treated surface had a surface roughness Ra of 0.9 μm. (3) Subsequently, a roughened layer comprising copper was formed in the same manner as in Example 1. The roughened layer comprising copper had a coating amount of copper of 150,000 μg/dm² and a surface roughness Ra of 1.4 μm. On the roughening-treated electrolytic copper foil was observed nodular copper formed all over the irregularities on the copper foil.

After the treatments (4) and (5) of Example 1 were carried out, the measurement of adhesive strength and tests for residual copper and powder falling were carried out in the same manner as in Example 1 (6), and the results are listed in Table 1.

Example 5

After the same electrolytic copper foil as that used in Example 1 was pickled and washed with water in the same manner as in Example 1, the mat surface (bonding surface) of the copper foil was treated by electrolysis at a current density of 6 A/dm² for 4 seconds in a plating bath, which contained 50 g/l of copper sulfate pentahydrate, 10 g/l of sodium tungstate dihydrate, 30 g/l of cobalt sulfate heptahydrate and 30 g/l of ferrous sulfate heptahydrate and was adjusted to pH 2.0 and to a bath temperature of 30° C., to form on the bonding surface of the copper foil a composite metal layer containing copper, tungsten, cobalt and iron. The coating amounts of the metals in the composite metal layer were measured by an ICP (inductively coupled plasma luminescent) analyzer to be 7,900 μg/dm² of copper, 200 μg/dm² of tungsten, 12 μg/dm² of cobalt and 50 μg/dm² of iron. After the treatment, the treated surface had a surface roughness Ra of 0.9 μm. Subsequently, a roughened layer comprising copper was formed in the same manner as in Example 1. The roughened layer had a surface roughness Ra of 1.5 μm. On the roughening-treated electrolytic copper foil was observed nodular copper formed all over the irregularities on the copper foil.

After the treatments (4) and (5) of Example 1 were carried out, the measurement of adhesive strength and tests for residual copper and powder falling were carried out in the same manner as in Example 1 (6), and the results are listed in Table 1.

Example 6

After the same electrolytic copper foil as that used in Example 1 was pickled and washed with water in the same manner as in Example 1, the mat surface (bonding surface) of the copper foil was treated by electrolysis at a current density of 7 A/dm² for 4 seconds in a plating bath, which contained 50 g/l of copper sulfate pentahydrate, 1 g/l of sodium tungstate dehydrate, 2 g/l of sodium molybdate dihydrate and 50 g/l of zinc sulfate heptahydrate and was adjusted to pH 2.5 and to a bath temperature of 30° C., to form on the bonding surface of the copper foil a composite metal layer containing copper, tungsten, molybdenum and zinc. The coating amounts of the metals in the composite metal layer were measured by an ICP (inductively coupled plasma luminescent) analyzer to be 9,200 μg/dm² of copper, 50 μg/dm² of tungsten, 180 μg/dm² of molybdenum and 160 μg/dm² of zinc. After the treatment, the treated surface had a surface roughness Ra of 0.9 μm. Subsequently, a roughened layer comprising copper was formed in the same manner as in Example 1. The roughened layer comprising copper had a surface roughness Ra of 1.4 μm. On the roughening-treated electrolytic copper foil was observed nodular copper formed all over the irregularities on the copper foil.

After the treatments (4) and (5) of Example 1 were carried out, the measurement of adhesive strength and tests for residual copper and powder falling were carried out in the same manner as in Example 1 (6), and the results are listed in Table 1.

Example 7

The same treatments as in Example 4 were repeated except that a 18 μm thick rolled copper foil (surface roughness Ra: 0.1 μm) was used, to form a composite metal layer containing copper, tungsten and nickel. The coating amounts of the metals in the composite metal layer were 7,900 μg/dm² of copper, 145 μg/dm² of tungsten and 128 μg/dm² of nickel. After the treatment, the treated surface had a surface roughness Ra of 0.1 μm. Subsequently, a roughened layer comprising copper was formed in the same manner as in Example 1. The roughened layer comprising copper had a surface roughness Ra of 0.5 μm.

After the treatments (4) and (5) of Example 1 were carried out, the measurement of adhesive strength and tests for residual copper and powder falling were carried out in the same manner as in Example 1 (6), and the results are listed in Table 1.

Example 8

The same treatments as in Example 4 were repeated except that a 12 μm thick electrolytic copper foil (surface roughness Ra of the mat surface: 0.2 μm) was used, to form a composite metal layer containing copper, tungsten and nickel. The coating amounts of the metals in the composite metal layer were 7,900 μg/dm² of copper, 150 μg/dm² of tungsten and 135 μg/dm² of nickel. After the treatment, the treated surface had a surface roughness Ra of 0.2 μm. Subsequently, a roughened layer comprising copper was formed in the same manner as in Example 1. The roughened layer comprising copper had a surface roughness Ra of 0.6 μm.

After the treatments (4) and (5) of Example 1 were carried out, the measurement of adhesive strength and tests for residual copper and powder falling were carried out in the same manner as in Example 1 (6), and the results are listed in Table 1.

Comparative Example 1

The same treatments as in Example 1 were repeated except that the step (3) for forming a roughened layer by using a plating bath containing copper sulfate was not carried out. The surface roughness Ra of obtained copper foil on the side of the mat surface was measured to be 0.9 μm. The measurement of adhesive strength and tests for residual copper and powder falling were carried out in the same manner as in Example 1 (6), and the results are listed in Table 1.

Comparative Example 2

The same treatments as in Example 4 were repeated except that the step (3) for forming a roughened layer by using a plating bath containing copper sulfate was not carried out. The surface roughness Ra of obtained copper foil on the side of the mat surface was measured to be 0.9 μm. The measurement of adhesive strength and tests for residual copper and powder falling were carried out in the same manner as in Example 1 (6), and the results are listed in Table 1.

Comparative Example 3

The same copper foil as that used in Example 1 was subjected to the treatments of Example 4 (1) and (2), washed with water and then treated by electrolysis at a current density of 30 A/dm² (not lower than the limiting current density) for 3 seconds by using a plating bath, which contained 130 g/l of copper sulfate pentahydrate and 100 g/l of sulfuric acid and was adjusted to a bath temperature of 30° C., to form a dendritic copper layer (burning plating). The dendritic copper layer had a coating amount of copper of 30,000 μg/dm² and a surface roughness Ra of 1.3 μm.

After the treatments (4) and (5) of Example 1 were carried out, the measurement of adhesive strength and tests for residual copper and powder falling were carried out in the same manner as in Example 1 (6), and the results are listed in Table 1.

Comparative Example 4

The same copper foil as that used in Example 1 was subjected to the treatments of Example 4 (1) and (2), washed with water and then treated by electrolysis at a current density of 5 A/dm² (lower than the limiting current density) for 80 seconds by using a plating bath, which contained 130 g/l of copper sulfate pentahydrate and 100 g/l of sulfuric acid and was adjusted to a bath temperature of 30° C., to form a smooth copper layer (covering plating). The smooth copper layer had a coating amount of copper of 132,000 μg/dm² and a surface roughness Ra of 1.1 μm.

After the treatments (4) and (5) of Example 1 were carried out, the measurement of adhesive strength and tests for residual copper and powder falling were carried out in the same manner as in Example 1 (6), and the results are listed in Table 1.

Comparative Example 5

Figure 2:
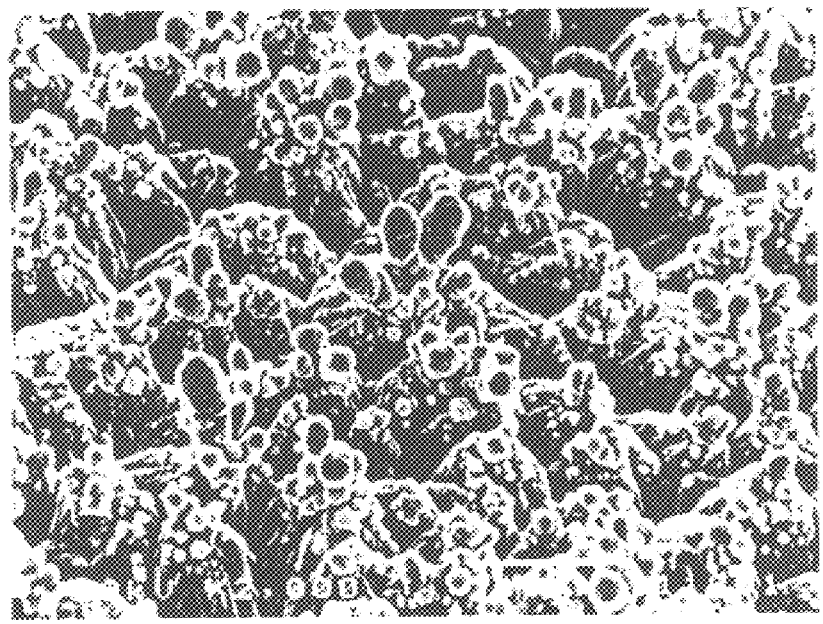
FIG. 2 is a scanning electron microscope photograph showing the roughened surface of the roughening-treated copper foil obtained in Comparative Example 5.

The same electrolytic copper foil as that used in Example 1 was pickled and washed with water in the same manner as in Example 1. Without forming a composite metal layer, the mat surface (bonding surface) of the copper foil was then treated in a plating bath of a bath temperature of 30° C. containing 130 g/l of copper sulfate pentahydrate and 100 g/l of sulfuric acid by ① electrolysis at a current density of 30 A/dm² (not lower than the limiting current density) for 3 seconds and ② electrolysis at a current density of 5 A/dm² (lower than the limiting current density) for 80 seconds, to form a roughened layer comprising copper. The roughened layer comprising copper had a coating amount of copper of 150,000 μg/dm² and a surface roughness Ra of 1.8 μm. On the roughening-treated electrolytic copper foil was observed the formation of nodular copper centered on the convexes on the irregular surface of the copper foil. FIG. 2 shows a scanning electron microscope photograph (magnification: 2000, object angle: 45°) of the roughened surface.

After the treatments (4) and (5) of Example 1 were carried out, the measurement of adhesive strength and tests for residual copper and powder falling were carried out in the same manner as in Example 1 (6), and the results are listed in Table 1.

Comparative Example 6

The same rolled copper foil as that used in Example 7 was pickled and washed with water in the same manner as in Example 1. Without forming a composite metal layer, the mat surface (bonding surface) of the copper foil was then treated in a plating bath of a bath temperature of 30° C. containing 130 g/l of copper sulfate pentahydrate and 100 g/l of sulfuric acid by ① electrolysis at a current density of 30 A/dm² (not lower than the limiting current density) for 3 seconds and ② electrolysis at a current density of 5 A/dm² (lower than the limiting current density) for 80 seconds, to form a roughened layer comprising copper. The roughened layer comprising copper had a coating amount of copper of 150,000 μg/dm² and a surface roughness Ra of 0.8 μm.

After the treatments (4) and (5) of Example 1 were carried out, the measurement of adhesive strength and tests for residual copper and powder falling were carried out in the same manner as in Example 1 (6), and the results are listed in Table 1.

Comparative Example 7

The same electrolytic copper foil as that used in Example 8 was pickled and washed with water in the same manner as in Example 1. Without forming a composite metal layer, the mat surface (bonding surface) of the copper foil was then treated in a plating bath of a bath temperature of 30° C. containing 130 g/l of copper sulfate pentahydrate and 100 g/l of sulfuric acid by ① electrolysis at a current density of 30 A/dm$^2$ (not lower than the limiting current density) for 3 seconds and ② electrolysis at a current density of 5 A/dm$^2$ (lower than the limiting current density) for 80 seconds, to form a roughened layer comprising copper. The roughened layer comprising copper had a coating amount of copper of 150,000 μg/dm$^2$ and a surface roughness Ra of 1.0 μm.

After the treatments (4) and (5) of Example 1 were carried out, the measurement of adhesive strength and tests for residual copper and powder falling were carried out in the same manner as in Example 1 (6), and the results are listed in Table 1.

Comparative Example 8

The same electrolytic copper foil as that used in Example 1 was pickled and washed with water in the same manner as in Example 1. Without forming a composite metal layer, the mat surface (bonding surface) of the copper foil was then treated by ① electrolysis in a plating bath of a bath temperature of 35° C. containing 100 g/l of copper sulfate pentahydrate, 120 g/l of sulfuric acid, 0.6 g/l of sodium tungstate dihydrate and 15 g/l of ferrous sulfate heptahydrate at a current density of 40 A/dm$^2$ (not lower than the limiting current density) for 3.5 seconds and ② electrolysis in a plating bath of a bath temperature of 50° C. containing 250 g/l of copper sulfate pentahydrate and 100 g/l of sulfuric acid at a current density of 5 A/dm$^2$ (lower than the limiting current density) for 80 seconds, to form a roughened copper layer containing tungsten and iron. The layer had a surface roughness Ra of 1.7 μm.

After the treatments (4) and (5) of Example 1 were carried out, the measurement of adhesive strength and tests for residual copper and powder falling were carried out in the same manner as in Example 1 (6), and the results are listed in Table 1.

TABLE 1

| | Adhesive strength kN/m | Residual copper | Powder-falling |
|---|---|---|---|
| Example 1 | 2.0 | No | No |
| Example 2 | 1.9 | No | No |
| Example 3 | 1.9 | No | No |
| Example 4 | 2.0 | No | No |
| Example 5 | 2.1 | No | No |
| Example 6 | 1.9 | No | No |
| Example 7 | 1.0 | No | No |
| Example 8 | 0.9 | No | No |
| Comp. Example 1 | 0.9 | No | Countless particles of about 0.1 μm in diameter |
| Comp. Example 2 | 0.9 | No | Countless particles of about 0.1 μm in diameter |
| Comp. Example 3 | 1.0 | No | Countless particles of about 1 μm in diameter |
| Comp. Example 4 | 1.3 | No | No |
| Comp. Example 5 | 1.6 | 15 particles of 10 μm or less in diameter | 23 particles of 2–10 μm in diameter |
| Comp. Example 6 | 0.5 | 8 particles of 10 μm or less in diameter | 15 particles of 2–10 μm in diameter |
| Comp. Example 7 | 0.5 | 7 particles of 10 μm or less in diameter | 18 particles of 2–10 μm in diameter |
| Comp. Example 8 | 1.7 | 2 particles of 10 μm or less in diameter | 3 particles of 2–10 μm in diameter |

As apparent from comparison of FIG. 1 with FIG. 2, unlike the roughening-treated copper foil obtained in Comparative Example 5 on which nodular copper was locally electrodeposited on the convexes on the copper foil surface, the roughening-treated copper foil obtained in Example 1 was coated with nodular copper, which was electrodeposited all over the concaves and convexes. Consequently, the adhesive strength was improved in spite of the low surface roughness (Ra), and the low value of Ra contributed to the prevention of residual copper on the surface of the base material after etching for forming printed circuits and the prevention of powder falling with low abrasion force.

When used to produce printed wiring boards, the roughening-treated copper foil of the present invention gives high adhesive strength between resin base materials and the copper foil, and as well effectively prevents residual copper and powder falling. Using it with high Tg materials, such as FR-5, is particularly effective in improving the adhesive strength between resin base materials and copper foil.

What is claimed is:

1. A method of producing a roughening-treated copper foil, comprising
   treating a copper foil as a cathode by electrolysis in a plating bath containing (i) copper ions, (ii) metal ions of at least one metal selected from the group consisting of tungsten and molybdenum and (iii) metal ions of at least one metal selected from the group consisting of nickel, cobalt, iron and zinc, at a current density lower than a limiting current density of the plating bath, to form on the copper foil a composite metal layer comprising (I) copper, (II) at least one metal selected from the group consisting of tungsten and molybdenum and (III) at least one metal selected from the group consisting of nickel, cobalt, iron and zinc; and
   forming a roughened layer comprising copper on the composite metal layer by carrying out electrolysis in a plating bath containing copper ions at a current density not lower than a limiting current density of the plating bath to form a dendritic copper electrodeposition layer and then carrying out subsequent electrolysis at a current density lower than the limiting current density of plating bath to form nodular copper.

2. The method of claim 1, wherein the plating bath containing (i) copper ions, (ii) metal ions of at least one metal selected from the group consisting of tungsten and molybdenum and (iii) metal ions of at least one metal selected from the group consisting of nickel, cobalt, iron and zinc has a pH of 1.5 to 5.0.

* * * * *